(12) United States Patent
Hanson et al.

(10) Patent No.: US 9,984,911 B2
(45) Date of Patent: May 29, 2018

(54) ELECTROSTATIC CHUCK DESIGN FOR HIGH TEMPERATURE RF APPLICATIONS

(71) Applicant: APPLIED MATERIALS, INC., Santa Clara, CA (US)

(72) Inventors: Ryan Hanson, Cupertino, CA (US); Manjunatha Koppa, Bangalore (IN); Vijay D. Parkhe, San Jose, CA (US); John C. Forster, Mountain View, CA (US); Keith A. Miller, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 309 days.

(21) Appl. No.: 14/962,446

(22) Filed: Dec. 8, 2015

(65) Prior Publication Data

US 2016/0172227 A1  Jun. 16, 2016

Related U.S. Application Data

(60) Provisional application No. 62/090,858, filed on Dec. 11, 2014.

(51) Int. Cl.
*H02N 13/00* (2006.01)
*H01L 21/683* (2006.01)

(52) U.S. Cl.
CPC ......... *H01L 21/6833* (2013.01); *H02N 13/00* (2013.01)

(58) Field of Classification Search
CPC .. H02N 13/00; H01L 21/6833; H01L 21/6831
USPC ....................................................... 361/234
See application file for complete search history.

(56) References Cited

U.S. PATENT DOCUMENTS

| | | |
|---|---|---|
| 6,673,636 B2 | 1/2004 | Ma |
| 7,737,702 B2 | 6/2010 | Pipitone |
| 7,750,645 B2 | 7/2010 | Pipitone et al. |
| 2004/0018127 A1 | 1/2004 | Long et al. |
| 2009/0044748 A1* | 2/2009 | Pipitone ............ H01J 37/32082 118/697 |
| 2009/0159439 A1* | 6/2009 | Pipitone ................ C23C 14/345 204/298.03 |

(Continued)

FOREIGN PATENT DOCUMENTS

EP  1 194 954 B1  5/2011

OTHER PUBLICATIONS

International Search Report and Written Opinion dated Mar. 29, 2016 for PCT Application No. PCT/US2015/064494.

*Primary Examiner* — Dharti Patel
(74) *Attorney, Agent, or Firm* — Moser Taboada; Alan Taboada

(57) ABSTRACT

An electrostatic chuck includes a puck having a support surface to support a substrate when disposed thereon and an opposing second surface, wherein one or more chucking electrodes are embedded in the puck, a body having a support surface coupled to the second surface of the puck to support the puck, a DC voltage sensing circuit disposed on support surface of the puck, and an inductor disposed in the body and proximate the support surface of the body, wherein the inductor is electrically coupled to DC voltage sensing circuit, and wherein the inductor is configured to filter high frequency current flow in order to accurately measure DC potential on the substrate.

20 Claims, 4 Drawing Sheets

(56) References Cited

U.S. PATENT DOCUMENTS

| | | |
|---|---|---|
| 2009/0178764 A1 | 7/2009 | Kanno et al. |
| 2011/0117682 A1* | 5/2011 | Nam ................. H01L 21/67069 438/10 |
| 2011/0209995 A1* | 9/2011 | Rasheed ........... H01J 37/32091 204/298.08 |
| 2013/0050892 A1* | 2/2013 | Kuthi .................... H01J 37/321 361/234 |
| 2014/0367267 A1* | 12/2014 | Egan ...................... G01B 7/105 205/84 |

* cited by examiner

ELECTROSTATIC CHUCK DESIGN FOR HIGH TEMPERATURE RF APPLICATIONS

CROSS-REFERENCE TO RELATED APPLICATIONS

This application claims benefit of U.S. provisional patent application Ser. No. 62/090,858, filed Dec. 11, 2014, which is herein incorporated by reference.

FIELD

Embodiments of the present disclosure generally relate to electrostatic chucks used to retain substrates in microelectronic device fabrication processes.

BACKGROUND

Physical Vapor Deposition (PVD) chambers that operate at high temperatures and high power levels provide several advantages for processing substrates. Although operating at high temperatures and high power improves film properties (e.g., stress density rho, and the like) and provides good RF receiver efficiency, high temperatures and high power causes overheating, substrate backside arcing, and chamber variation. Specifically, existing electrostatic chucks (ESC) currently used for high temperature/high power Physical Vapor Deposition (PVD) applications have limitations when used with RF power. Those limitations may include, but are not limited to, 1) ESC overheating when the RF current in the electrodes gets too high during high power processes, 2) substrate backside arcing to a DC voltage sensing circuit (i.e., referred to herein as a Vdc sensing terminal or center-tap (c-tap) circuit) disposed on the surface of the ESC in very high frequency (VHF) applications, and 3) process variations caused by unshielded wiring that provides power to various components such as heaters and electrodes disposed in the ESC.

In view of the foregoing limitations, there is a need for an improved electrostatic chuck to eliminate or reduce the aforementioned problems associated with high temperature/high power PVD processes.

SUMMARY

An electrostatic chuck includes a puck having a support surface to support a substrate when disposed thereon and an opposing second surface, wherein one or more chucking electrodes are embedded in the puck, a body having a support surface coupled to the second surface of the puck to support the puck, a DC voltage sensing circuit disposed on support surface of the puck, and an inductor disposed in the body and proximate the support surface of the body, wherein the inductor is electrically coupled to DC voltage sensing circuit, and wherein the inductor is configured to filter high frequency current flow in order to accurately measure DC potential on the substrate.

In some embodiments, an electrostatic chuck includes a puck having a support surface to support a substrate when disposed thereon and an opposing second surface, wherein one or more chucking electrodes are embedded in the puck, wherein a thickness of each of the one or more chucking electrodes is about 3 to about 5 times a calculated skin depth of the one or more chucking electrodes, and a body having a support surface coupled to the second surface of the puck to support the puck.

In some embodiments, an electrostatic chuck includes a puck having a support surface to support a substrate when disposed thereon and an opposing second surface, wherein one or more chucking electrodes are embedded in the puck, wherein a thickness of each of the one or more chucking electrodes is about 3 to about 5 times a calculated skin depth of the one or more chucking electrodes, and wherein the one or more chucking electrodes is coupled to a chucking power supply via a set of one or more high temperature coaxial cables, a body having a support surface coupled to the second surface of the puck to support the puck, a DC voltage sensing circuit disposed on support surface of the puck, and an inductor disposed in the body and proximate the support surface of the body, wherein the inductor is electrically coupled to DC voltage sensing circuit, and wherein the inductor is configured to filter high frequency current flow in order to accurately measure DC potential on the substrate.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
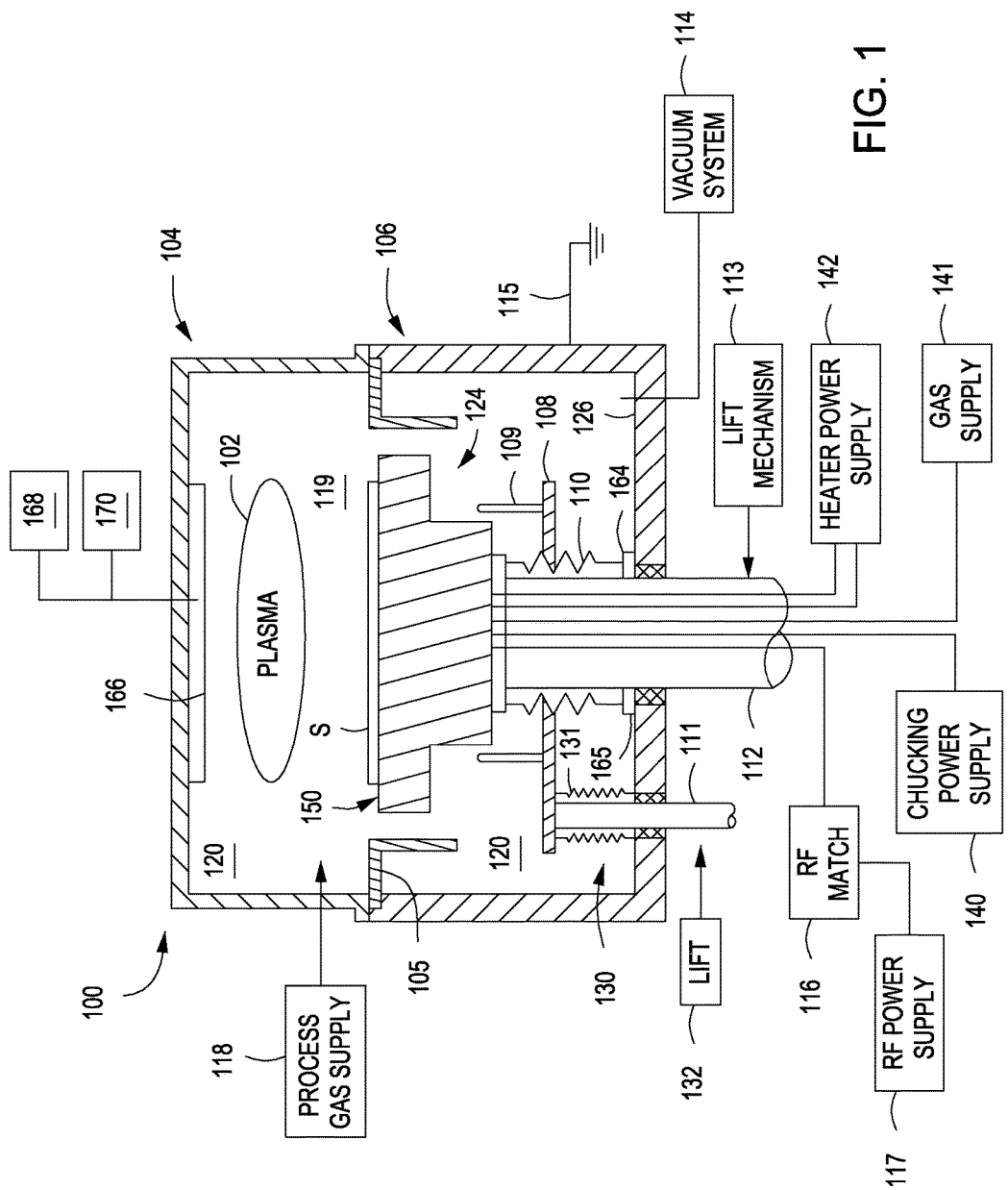
FIG. 1 depicts a process chamber suitable for use with an electrostatic chuck in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of high temperature RF/VHF electrostatic chucks are provided herein. The inventive electrostatic chucks may advantageously operate in high temperature and/or high power environments to prevent overheating, reduce backside arcing between the substrate and the ESC support surface, and enable repeatable performance and higher efficiency in RF applications. Specifically, embodiments of the ESC provided herein may include thicker embedded electrodes in the puck of the ESC which reduces current density and enables higher current without overheating, a high temperature inductor in close proximity to the ESC DC voltage sensing circuit which increases RF impedance and thus enabling DC voltage sensing of the ESC puck surface at higher RF powers and frequencies, and/or high temperature wiring which enables repeatable performance and higher efficiency in RF applications.

FIG. 1 is a schematic cross-sectional view of plasma processing chamber in accordance with some embodiments of the present disclosure. In some embodiments, the plasma processing chamber is a PVD processing chamber. However, other types of processing chambers can also use or be modified for use with embodiments of the inventive electrostatic chuck described herein. The PVD processing chamber and ESC described herein may operate at temperatures of about 200° Celsius to about 500° Celsius, and at power levels between about 5 kW to about 10 kW of power at frequencies of about 13 MHz to about 60 MHz.

The chamber 100 is a vacuum chamber which is suitably adapted to maintain sub-atmospheric pressures within a chamber interior volume 120 during high temperature/high power substrate processing. The chamber 100 includes a chamber body 106 covered by a lid 104 which encloses a processing volume 119 located in the upper half of chamber interior volume 120. The chamber 100 may also include one or more shields 105 circumscribing various chamber components to prevent unwanted reaction between such components and ionized process material. The chamber body 106 and lid 104 may be made of metal, such as aluminum. The chamber body 106 may be grounded via a coupling to ground 115.

A substrate support 124 is disposed within the chamber interior volume 120 to support and retain a substrate S, such as a semiconductor substrate, for example, or other such substrate as may be electrostatically retained. The substrate support 124 may generally comprise an electrostatic chuck 150 (described in more detail below with respect to FIGS. 2-4) and a hollow support shaft 112 for supporting the electrostatic chuck 150. The hollow support shaft 112 provides a conduit to provide, for example, process gases, fluids, coolants, power, or the like, to the electrostatic chuck 150.

In some embodiments, the hollow support shaft 112 is coupled to a lift mechanism 113 which provides vertical movement of the electrostatic chuck 150 between an upper, processing position (as shown in FIG. 1) and a lower, transfer position (not shown). A bellows assembly 110 is disposed about the hollow support shaft 112 and is coupled between the electrostatic chuck 150 and a bottom surface 126 of chamber 100 to provide a flexible seal that allows vertical motion of the electrostatic chuck 150 while preventing loss of vacuum from within the chamber 100. The bellows assembly 110 also includes a lower bellows flange 164 in contact with an o-ring 165 or other suitable sealing element which contacts bottom surface 126 to help prevent loss of chamber vacuum.

The hollow support shaft 112 provides a conduit for coupling a heater power supply 142, a gas supply 141, a chucking power supply 140, RF sources (e.g., RF plasma power supply 170 and RF bias power supply 117) to the electrostatic chuck 150, fluid/gas source for cooling (not shown), etc. In some embodiments, RF plasma power supply 170 and RF bias power supply 117 are coupled to the electrostatic chuck via respective RF match networks (only RF match network 116 shown).

A substrate lift 130 may include lift pins 109 mounted on a platform 108 connected to a shaft 111 which is coupled to a second lift mechanism 132 for raising and lowering the substrate lift 130 so that the substrate "S" may be placed on or removed from the electrostatic chuck 150. The electrostatic chuck 150 includes thru-holes (described below) to receive the lift pins 109. A bellows assembly 131 is coupled between the substrate lift 130 and bottom surface 126 to provide a flexible seal which maintains the chamber vacuum during vertical motion of the substrate lift 130.

The chamber 100 is coupled to and in fluid communication with a vacuum system 114 which includes a throttle valve (not shown) and vacuum pump (not shown) which are used to exhaust the chamber 100. The pressure inside the chamber 100 may be regulated by adjusting the throttle valve and/or vacuum pump. The chamber 100 is also coupled to and in fluid communication with a process gas supply 118 which may supply one or more process gases to the chamber 100 for processing a substrate disposed therein.

In operation, for example, a plasma 102 may be created in the chamber interior volume 120 to perform one or more processes. The plasma 102 may be created by coupling power from a plasma power source (e.g., RF plasma power supply 170) to a process gas via one or more electrodes proximate to or within the chamber interior volume 120 to ignite the process gas and creating the plasma 102. In some embodiments, a bias power may also be provided from a bias power supply (e.g., RF bias power supply 117) to one or more electrodes (described below) disposed within the electrostatic chuck 150 via a capacitively coupled bias plate (described below) to attract ions from the plasma towards the substrate S.

In some embodiments, for example where the chamber 100 is a PVD chamber, a target 166 comprising a source material to be deposited on a substrate S may be disposed above the substrate and within the chamber interior volume 120. The target 166 may be supported by a grounded conductive portion of the chamber 100, for example an aluminum adapter through a dielectric isolator. In other embodiments, the chamber 100 may include a plurality of targets in a multi-cathode arrangement for depositing layers of different material using the same chamber.

A controllable DC power source 168 may be coupled to the chamber 100 to apply a voltage, or bias, to the target 166. In some embodiments consistent with the inventive ESC described herein, the DC power source 168 may provide about 5 kW to about 10 kW of power at frequency of about 2 MHz to about 162 MHz. In some embodiments consistent with the inventive ESC described herein, the DC power source 168 may provide 7 kW of power at 40 MHz.

The RF bias power supply 117 may be coupled to the substrate support 124 in order to induce a negative DC bias on the substrate S. In some embodiments, the RF bias power supply 117 provides 13.566 MHz bias power to electrodes embedded in the ESC 150. In addition, in some embodiments, a negative DC self-bias may form on the substrate S during processing. In some embodiments, an RF plasma power supply 170 may also be coupled to the chamber 100 to apply RF power to the target 166 to facilitate control of the radial distribution of a deposition rate on substrate S. In operation, ions in the plasma 102 created in the chamber 100 react with the source material from the target 166. The reaction causes the target 166 to eject atoms of the source material, which are then directed towards the substrate S, thus depositing material.

Figure 2:
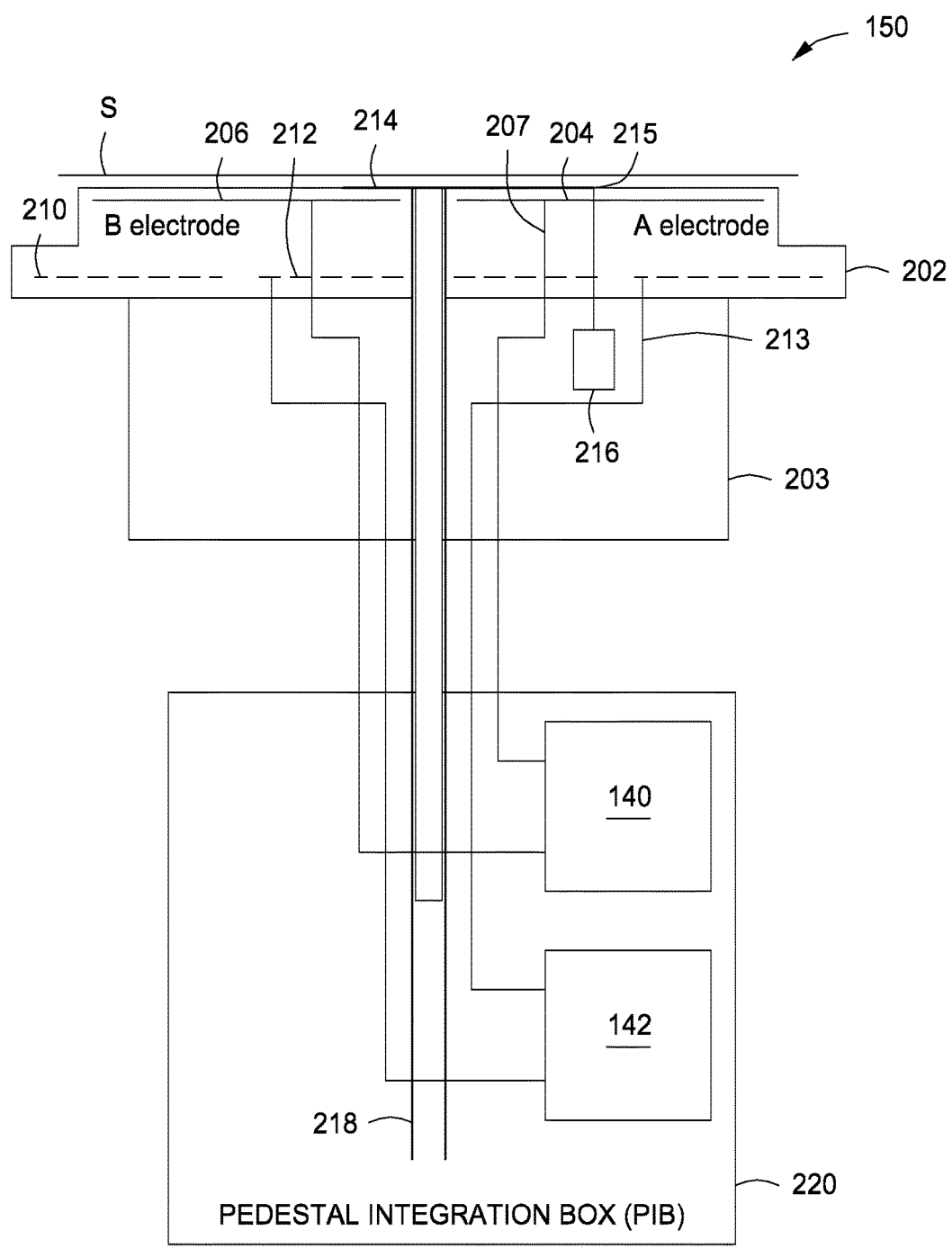
FIG. 2 depicts a cross sectional view of an electrostatic chuck in accordance with some embodiments of the present disclosure.

FIG. 2 depicts a cross-sectional view of an electrostatic chuck (ESC 150) in accordance with embodiments of the present disclosure. The ESC 150 includes a puck 202 having a support surface to support a substrate and an opposing bottom second surface. The ESC further includes a body 203 coupled to and extending from the bottom second surface of the puck 202 to support the puck. In some embodiments, the body acts as a radio frequency (RF) bias plate disposed below the dielectric puck. Also shown in FIG. 2 is a pedestal integration box 220 that houses/integrates some of the components used by the ESC 150.

In some embodiments the puck 202 is a dielectric disk made from a ceramic material. The puck 202 includes one or more embedded chucking electrodes 204, 206. The one or more embedded chucking electrodes 204, 206 may include an A electrode (e.g., 204) disposed on a first side of the puck 202, and a B electrode (e.g., 206) disposed on a second side of the puck. Each of the electrodes may be independently controlled to provide opposite voltages to each electrode to create the desired electrostatic forces to retain the substrate. In some embodiments, the one or more embedded chucking electrodes 204, 206 are configured to receive about 40 MHz and to launch about 13.56 MHz.

The inventors discovered that typical thin electrodes overheated and acted like resistive heating elements during high powered applications. As used herein, a thin electrode is an electrode having a thickness of about 1 skin depth. RF current flows mainly at the "skin" of the conductor, between the outer surface and a level called the skin depth. Skin depth is a measure of how far electrical conduction takes place in a conductor, and is a function of frequency. The skin depth is also a function of the material properties of the conductor (i.e., the one or more electrodes) as well as the frequency being used. The lower the frequency, the larger the skin depth. In some embodiments, the chucking electrodes 204, 206 are made from tungsten. A typical thin electrode for a tungsten electrode at 40 MHz is about 18 microns. The inventors have discovered that by increasing the thickness of the electrodes to be about 3 to 5 skin depths, or about 50 microns to about 90 microns for tungsten, and spreading the RF current through more skin depths, the electrode does not heat up as much. That is, by making the chucking electrodes 204, 206 thicker, the current density decreases and, therefore, the heating effect of the electrodes decreases. In the thicker electrodes, about 60% of the RF current flows in the first skin depth, 20% of the RF current flows in the second skin depth, 10% of the RF current flows in the third skin depth, 5% of the RF current flows in the fourth skin depth, and so on. In other embodiments, the chucking electrodes 204, 206 may be made from other conductive materials such as, for example, stainless steel and the like. In some embodiments, the thickness of the electrodes would be selected based on the calculated skin depth for the selected material of the electrodes, and the frequencies that will be used.

The well-known equation for skin depth is as follows: (Skin Depth) is a function of three variables, frequency (f), resistivity (ρ), and relative permeability ($\mu_R$):

$$\text{Skin Depth} = \delta_3 = \sqrt{\frac{2\rho}{2\pi f \mu_0 \mu_R}}$$

where
ρ=bulk resistivity (ohm-meters)
f=frequency (Hertz)
$\mu_0$=permeability constant (Henries/meter)=$4\pi \times 10^{-7}$
$\mu_R$=relative permeability (usually~1)

In addition to providing opposite voltages to each electrode, different power levels may be provided to each of the one or more chucking electrodes 204, 206 to compensate for existing surface charges on the puck. Typically, a DC voltage sensing circuit 214 (i.e., center tap or c-tap), that contacts the bottom surface of the substrate is used to determine/measure the existing DC potential on the substrate. The determined/measured existing DC potential on the substrate is used to adjust the chucking power supplied by chucking power supply 140 to each of the A electrode (e.g., 204) and the B electrode (e.g., 206) such that the substrate may be uniformly chucked across the entire diameter of the substrate. In embodiments consistent with the present disclosure, the DC voltage sensing circuit 214 is coupled via terminal 215 to an inductor 216 disposed in the body 203 of the ESC 150 close to the puck surface. In some embodiments, the inductor 216 is disposed about 0.5 inches to about 2.5 inches radially outward from the center of the puck 202. In some embodiments, the inductor 216 is disposed about 0.25 inches to about 5 inches from the top surface of the puck 202. In typical c-tap configurations where the RF filter/inductor is located over 12 inches away from the puck surface in a lower part of the ESC, the inventors discovered that during high power application (i.e., 13 MHz and greater), backside arcing between the substrate and the c-tap circuit trace on the ESC support surface occurs. By providing the DC voltage sensing circuit 214 and inductor 216 (i.e., filter) closer to the surface of the puck, embodiments consistent with the present disclosure advantageously avoid, or at least greatly reduce, backside arcing. In some embodiments, the inductor 216 is a ceramic inductor. In some embodiments, the inductor 216 is about 1 inch tall. The inductor 216 stops the RF current from flowing and filters the high frequency current flow in order to accurately measure the DC potential on the substrate.

Figure 3A:
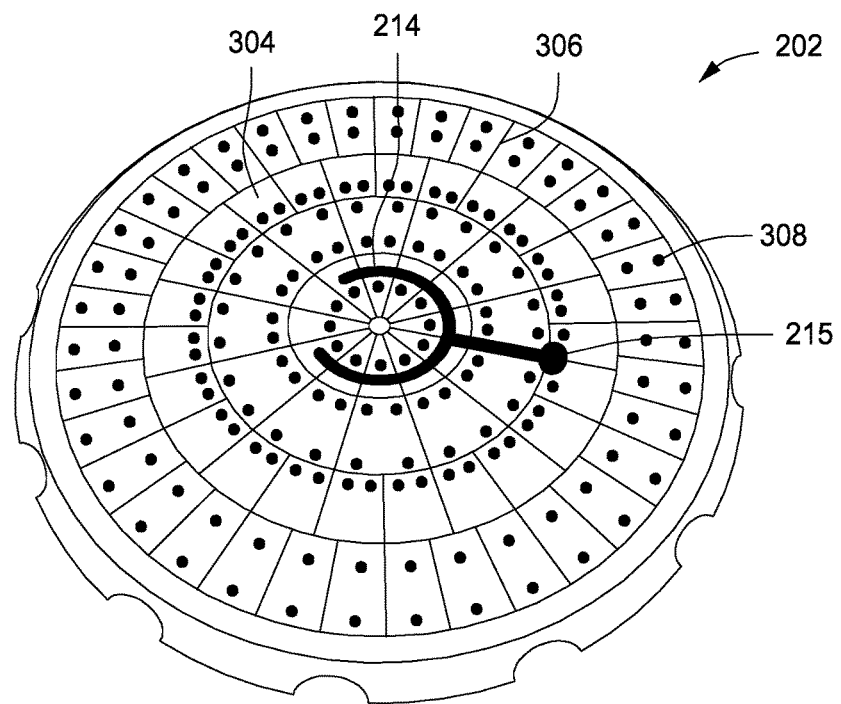
FIGS. 3A and 3B depict a top view of a puck surface of an electrostatic chuck in accordance with some embodiments of the present disclosure.
Figure 3B:
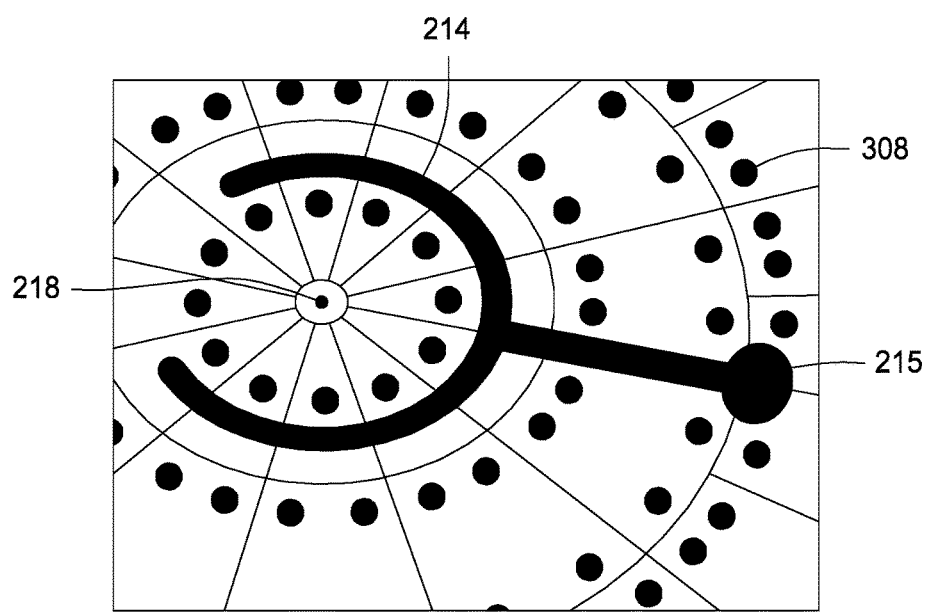

FIGS. 3A and 3B depict a top view of a puck surface 304 including the DC voltage sensing circuit 214 trace that is coupled to terminal 215, which is coupled to inductor 216, in accordance with some embodiments of the present disclosure. In some embodiments, the puck surface 304 may further include backside gas channels 306, gas holes 308, and gas tube 218 to provide backside cooling and/or dechucking gas pressure, for example.

The chucking power supply 140 may be coupled to the one or more embedded chucking electrodes 204, 206 via high temperature wiring cables 207. Similarly, heater power supply 142 may be coupled to the one or more embedded resistive heaters via high temperature wiring cables 213. The one or more embedded resistive heaters may include an outer heater 210 and an inner heater 212 that are independently controlled. In embodiments consistent with the present disclosure, the high temperature wiring cables 207 and/or 213 are high temperature coaxial cables (i.e., RF shielded cables). Specifically, the inventors have discovered that unshielded cables for conducting RF to and from electrodes embedded in the ESC can cause impedance variations. These variations based on the unshielded wiring and how the wiring is routed make repeatability of processes extremely difficult within the same chamber, let alone between chambers. That is, chambers using unshielded cables are sensitive to variations in the routing of the unshielded cables and produce problems with substrate uniformity and consistency. Thus, the inventors have discussed that using shielded coaxial cables (i.e., high temperature wiring cable 207, 213) specifically designed for high temperature applications (i.e., about 200° Celsius to about 500° Celsius), enables repeatable chamber performance and higher efficiency in RF applications.

Figure 4:
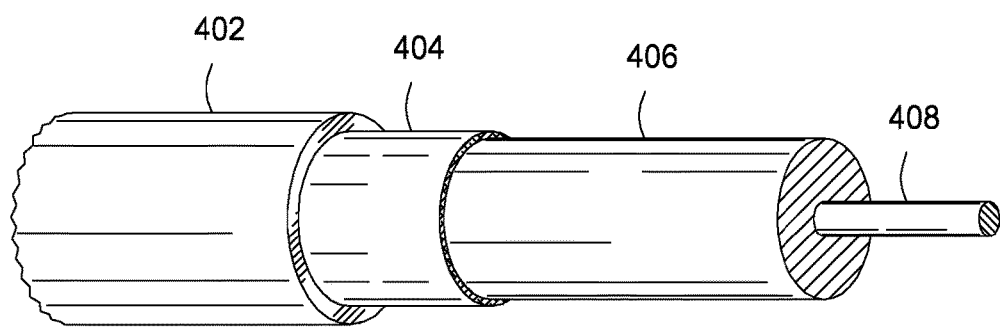
FIG. 4 depicts a cut away perspective view of a portion of a coaxial cable of FIG. 1 in accordance with some embodiments of the present disclosure.

FIG. 4 depicts a cut away perspective view of a portion of a high temperature wiring cable 207 of FIG. 1 in accordance with some embodiments of the present disclosure. Specifically, high temperature wiring cable 207 is a coaxial cable that includes a high temperature jacket 402 that can withstand temperatures of about 200° Celsius to about 500° Celsius. In some embodiments, the high temperature jacket 402 is a ceramic dielectric insulator which withstands the high temperature. The high temperature wiring cable 207 may include a RF shielding 404 that is formed from metallic material. In some embodiments, the RF shielding is a solid metal tube shielding. The high temperature wiring cable 207 further includes a dielectric core 406 and a center conductor 408.

While the foregoing is directed to embodiments of the present disclosure, other and further embodiments of the disclosure may be devised without departing from the basic scope thereof.

The invention claimed is:

1. An electrostatic chuck, comprising:
   a puck having a support surface to support a substrate when disposed thereon and an opposing second surface, wherein one or more chucking electrodes are embedded in the puck;
   a body having a support surface coupled to the second surface of the puck to support the puck;
   a DC voltage sensing circuit disposed on the support surface of the puck; and
   an inductor disposed in the body and proximate the support surface of the body, wherein the inductor is electrically coupled to DC voltage sensing circuit, and wherein the inductor is configured to filter high frequency current flow in order to accurately measure DC potential on the substrate.

2. The electrostatic chuck of claim 1, wherein the puck is a dielectric disk.

3. The electrostatic chuck of claim 1, wherein the DC voltage sensing circuit includes a conductive metallic trace proximate to and disposed partially about a center portion of the puck.

4. The electrostatic chuck of claim 3, wherein the conductive metallic trace includes a linear trace portion that extends from about 0.5 inches to about 2.5 inches radially outward from the center portion of the puck, wherein the linear trace portion is electrically coupled to an electrical terminal, and wherein the electrical terminal is electrically coupled to the inductor.

5. The electrostatic chuck of claim 1, wherein the inductor is disposed about 0.5 inches to about 2.5 inches from the support surface of the puck.

6. The electrostatic chuck of claim 1, wherein the inductor is a ceramic inductor.

7. The electrostatic chuck of claim 1, wherein the one or more chucking electrodes include two independently controlled electrodes embedded in the puck.

8. The electrostatic chuck of claim 1, wherein a thickness of each of the one or more chucking electrodes is about 3 to about 5 times a calculated skin depth of the one or more chucking electrodes.

9. The electrostatic chuck of claim 1, the one or more chucking electrodes are configured to carry about 13.56 MHz power to about 40 MHz power.

10. The electrostatic chuck of claim 1, wherein each of the one or more chucking electrodes is made from tungsten and have a thickness of about 50 microns to about 90 microns.

11. The electrostatic chuck of claim 1, wherein the one or more chucking electrodes are coupled to a chucking power supply via a first set of one or more high temperature coaxial cables.

12. The electrostatic chuck of claim 11, wherein the first set of one or more high temperature coaxial cables includes a high temperature jacket that can withstand temperatures of about 200° Celsius to about 500° Celsius, a solid metal RF shielding, a dielectric core, and a center conductor.

13. The electrostatic chuck of claim 1, further comprising one or more resistive heating elements embedded in the puck.

14. The electrostatic chuck of claim 13, wherein the one or more resistive heating elements are coupled to a heating power supply via a second set of one or more high temperature coaxial cables.

15. The electrostatic chuck of claim 1, wherein the support surface of the puck includes a plurality of gas channels formed thereon and a plurality of gas holes.

16. An electrostatic chuck, comprising:
   a puck having a support surface to support a substrate when disposed thereon and an opposing second surface, wherein one or more chucking electrodes are embedded in the puck, wherein a thickness of each of the one or more chucking electrodes is about 3 to about 5 times a calculated skin depth of the one or more chucking electrodes;
   a DC voltage sensing circuit disposed on the support surface of the puck; and
   a body having a support surface coupled to the opposing second surface of the puck to support the puck.

17. The electrostatic chuck of claim 16, wherein the one or more chucking electrodes include two independently controlled electrodes embedded in the puck.

18. The electrostatic chuck of claim 16, wherein each of the one or more chucking electrodes is made from tungsten and have a thickness of about 50 microns to about 90 microns.

19. The electrostatic chuck of claim 16, wherein the one or more chucking electrodes are coupled to a chucking power supply via a set of one or more high temperature coaxial cables.

20. An electrostatic chuck, comprising:
   a puck having a support surface to support a substrate when disposed thereon and an opposing second surface, wherein one or more chucking electrodes are embedded in the puck, wherein a thickness of each of the one or more chucking electrodes is about 3 to about 5 times a calculated skin depth of the one or more chucking electrodes, and wherein the one or more chucking electrodes is coupled to a chucking power supply via a set of one or more high temperature coaxial cables;
   a body having a support surface coupled to the second surface of the puck to support the puck;
   a DC voltage sensing circuit disposed on the support surface of the puck; and
   an inductor disposed in the body and proximate the support surface of the body, wherein the inductor is electrically coupled to DC voltage sensing circuit, and wherein the inductor is configured to filter high frequency current flow in order to accurately measure DC potential on the substrate.

* * * * *